United States Patent
Wang et al.

(10) Patent No.: US 8,896,135 B2
(45) Date of Patent: Nov. 25, 2014

(54) ENCAPSULATION FILM, PACKAGE STRUCTURE UTILIZING THE SAME, AND METHOD FOR FORMING THE PACKAGE STRUCTURE

(75) Inventors: Ching-Chiun Wang, Miaoli County (TW); Kang-Feng Lee, Taipei (TW); Feng-Yu Tsai, Taipei (TW); Ming Horn Zheng, Taichung County (TW); Chih-Yung Huang, Dali (TW); Shih-Chin Lin, Yonghe (TW); Jen-Rong Huang, Taipei (TW)

(73) Assignee: Industrial Technology Research Institute, Hsinchu County (TW)

( * ) Notice: Subject to any disclaimer, the term of this patent is extended or adjusted under 35 U.S.C. 154(b) by 12 days.

(21) Appl. No.: 12/984,542

(22) Filed: Jan. 4, 2011

(65) Prior Publication Data

US 2012/0032355 A1  Feb. 9, 2012

(30) Foreign Application Priority Data

Aug. 9, 2010 (TW) ............................. 99126437 A
Nov. 23, 2010 (TW) ............................. 99140309 A

(51) Int. Cl.
*H01L 23/28* (2006.01)
*H01L 21/56* (2006.01)
*C08F 8/42* (2006.01)
*H01L 31/048* (2014.01)
*H01L 33/56* (2010.01)

(52) U.S. Cl.
CPC . *C08F 8/42* (2013.01); *Y02E 10/50* (2013.01); *H01L 31/0481* (2013.01); *H01L 33/56* (2013.01)

USPC ............ 257/788; 257/E23.116; 257/E23.117; 257/E23.118; 257/E23.119; 257/E21.502; 313/512; 438/127

(58) Field of Classification Search
USPC ........... 257/788, E23.116, E23.117, E23.118, 257/E23.119, E21.502; 438/127; 313/512
See application file for complete search history.

(56) References Cited

U.S. PATENT DOCUMENTS 5,650,019 A  7/1997 Yamada et al.
5,728,230 A  3/1998 Komori et al.
(Continued)

FOREIGN PATENT DOCUMENTS

CN  201266610 Y  7/2009
CN  101499491 A  8/2009
(Continued)

OTHER PUBLICATIONS

Choi et al., "Evaluation of gas permeation barrier properties using electrical measurements of calcium degradation", Review of Scientific Instruments 78, 064701 (2007), American Institute of Physics.
(Continued)

*Primary Examiner* — Peniel M Gumedzoe
(74) *Attorney, Agent, or Firm* — Pai Patent & Trademark Law Firm; Chao-Chang David Pai

(57) ABSTRACT

Disclosed is an encapsulation film. An inorganic oxide film is formed on an organic sealing layer by an atomic layer deposition (ALD) to form the encapsulation film, wherein the organic sealing layer is a polymer containing hydrophilic groups. The organic sealing layer and the inorganic oxide layer have covalent bondings therebetween. The encapsulation film can solve the moisture absorption problem of conventional organic sealing layers, thereby being suitable for use as a package of optoelectronic devices.

5 Claims, 1 Drawing Sheet

(56) References Cited

U.S. PATENT DOCUMENTS

| | | | |
|---|---|---|---|
| 6,133,522 A | 10/2000 | Kataoka et al. | |
| 6,150,187 A * | 11/2000 | Zyung et al. | 438/26 |
| 7,255,926 B2 | 8/2007 | Bayer et al. | |
| 2002/0003403 A1 * | 1/2002 | Ghosh et al. | 313/512 |
| 2005/0023974 A1 * | 2/2005 | Chwang et al. | 313/512 |
| 2006/0246811 A1 * | 11/2006 | Winters et al. | 445/25 |
| 2007/0295390 A1 * | 12/2007 | Sheats et al. | 136/251 |
| 2008/0128018 A1 | 6/2008 | Hayes | |
| 2010/0276818 A1 * | 11/2010 | Maindron et al. | 257/789 |

FOREIGN PATENT DOCUMENTS

| | | |
|---|---|---|
| CN | 101641400 A | 2/2010 |
| CN | 101654279 A | 2/2010 |
| CN | 201466033 U | 5/2010 |
| CN | 101764163 A | 6/2010 |
| CN | 201570502 U | 9/2010 |

OTHER PUBLICATIONS

Lewis et al., "Thin-Film Permeation-Barrier Technology for Flexible Organic Light-Emitting Devices", IEEE Journal of Selected Topics in Quantum Electronics, vol. 10, No. 1, Jan./Feb. 2004.

Henry et al., "A microstructural study of transparent metal oxide gas barrier films", Thin Solid Films 355-356 (1999) 500-505, Elsevier.

Office Action (Notification of Examination Opinion) issued by the Taiwan Intellectual Property Office on Jul. 19, 2013, for the above-referenced application's counterpart application in Taiwan (Application No: 099140309).

Notification of First Examination Opinion issued by China's State Intellectual Property Office on Dec. 25, 2013, for the above-referenced application's counterpart application in China (Application No. 201010562736.X).

* cited by examiner

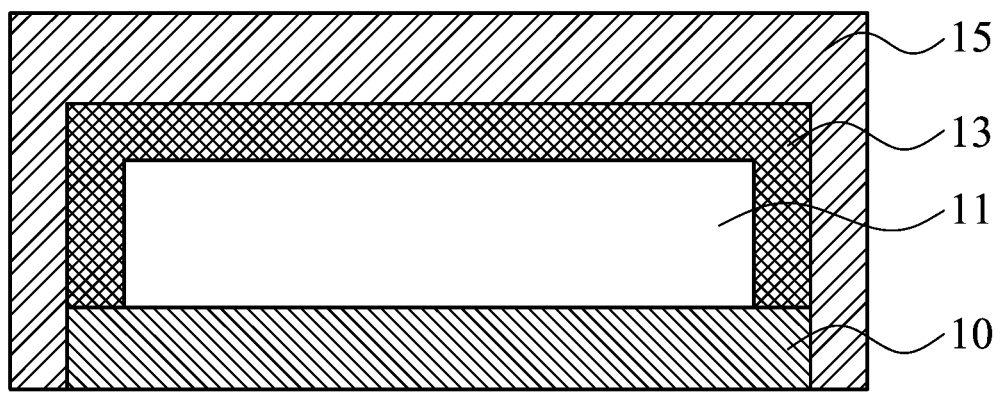

ENCAPSULATION FILM, PACKAGE STRUCTURE UTILIZING THE SAME, AND METHOD FOR FORMING THE PACKAGE STRUCTURE

CROSS REFERENCE TO RELATED APPLICATIONS

This Application claims priorities of Taiwan Patent Application No. 099126437, filed on Aug. 9, 2010, and Taiwan Patent Application No. 099140309, filed on Nov. 23, 2010, the entireties of which are incorporated by reference herein.

BACKGROUND OF THE INVENTION

1. Field of the Invention

The invention relates to a package structure, and in particular relates to an encapsulation film used in the package structure.

2. Description of the Related Art

Most of commercial solar cell modules utilize ethylene vinyl acetate copolymer (EVA) having good moisture resistance as their packaging material. However, the carbonyl resins, e.g. EVA, are easily damaged and yellowed under UV radiation from sun exposure. As such, the transmittance of the solar light through the carbonyl resins is reduced. One alternative is to replace the carbonyl resin with a poly(vinyl butyryl-co-vinyl alcohol-co-vinyl acetate having high UV transmittance. Nevertheless, the hydroxyl groups of the copolymer easily absorb moisture, which cannot prevent the solar cells from moisture damage. Accordingly, a method for reducing the moisture absorption of copolymer containing hydroxyl groups is called for, wherein the modified copolymer can be applied to optotronic devices such as solar cells.

BRIEF SUMMARY OF THE INVENTION

The disclosure provides an encapsulation film, including an organic layer composed of a polymer containing hydrophilic groups, and an inorganic oxide layer formed on the organic layer, wherein the inorganic oxide layer and the organic layer have covalent bondings therebetween.

The disclosure also provides a package structure, including an optotronic device; and the described encapsulation film wrapping the optotronic device, wherein the organic layer is disposed between the optotronic device and the inorganic oxide layer.

The disclosure further provides a method for forming a package structure, including providing an optotronic device, wrapping the optotronic device by an organic layer composed of a polymer having hydrophilic groups, and depositing an inorganic oxide layer on the organic layer by an atomic layer deposition process, wherein the inorganic oxide layer and the organic layer have covalent bondings therebetween.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein:

FIG. 1 is a schematic view showing a package structure in one embodiment of the invention.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

The disclosure provides a method of forming a package structure. As shown in FIG. 1, an optotronic device 11 is provided on a substrate 10. The substrate 10 can be a flexible material such as plastic. The optotronic device 11 can converse electricity to light, e.g. a light emitting diode (LED) or a liquid crystal display (LCD). Alternatively, the optotronic device 11 can converse light to electricity, e.g. a solar cell. Subsequently, an organic polymer, polymerized from monomers containing hydrophilic groups, serves as an organic sealing layer 13 for wrapping the optotronic device 11. Said hydrophilic groups, including but not limited to hydroxyl groups or carboxylic acid groups, are free after polymerization and capable of engaging a subsequent atomic layer deposition process. The organic sealing layer 13 includes polyvinyl alcohol (PVA), polyacrylic acid, polyvinyl butyral (PVB), or polyhydroxyethyl methacrylate (PHEMA). When the wrapping step is completed, the organic sealing layer 13 surface has the free hydrophilic groups thereon. In one embodiment, the hydrophilic groups are hydroxyl groups or carboxylic acid groups, and the organic sealing layer 13 can be polyvinyl alcohol (PVA). In another embodiment, the described monomer (first monomer) containing the hydrophilic groups can be further copolymerized with another monomer (second monomer) not having any hydrophilic groups to form the organic sealing layer 13, wherein the first and the second monomers have a molar ratio greater than 50:50. If the molar ratio of the first monomer is less that that of the second monomer, the nucleation and the growth of a later atomic layer deposition (ALD) will be prohibited. The monomer having hydrophilic groups after polymerization includes vinyl alcohol, vinyl butyral, or HEMA. The monomer having hydrophobic groups after polymerization includes ethylene, propylene, butene, vinyl chloride, isoprene, styrene, imide, methylmethacrylate (MMA), or vinyl acetate, For example, the organic sealing layer 13 can be poly(vinyl butryl-co-vinyl alcohol-co-vinyl acetate or copolymer of HEMA and MMA, wherein the hydrophilic HEMA and the hydrophobic MMA have a preferable molar ratio of greater than 50:50. The optotronic device 13 can be wrapped under the organic sealing layer 13 by a spin coating process. In one embodiment, the organic sealing layer 13 has a thickness of 1 μm to 20 μm. An overly thin organic sealing layer 13 cannot efficiently wrap the substrate, thereby influencing the quality of a subsequently grown inorganic oxide layer. On the other hand, an overly thick organic sealing layer 13 will reduce transmittance thereof.

Next, the inorganic oxide layer 15 is formed on the organic sealing layer 13 by the ALD. The ALD is a low temperature process performed at 50° C. to 120° C. Overly low ALD temperatures may extend the growth period of the inorganic oxide layer 15, and overly high ALD temperatures may damage the organic sealing layer 13 or even damage the optotronic device 11 beneath the organic sealing layer. The concept of the ALD process is to heat a precursor gas to form a pulse, thereby progressively growing films layer by layer on a surface of a substrate. For example, the vapor of heated trimethylaluminum can be carried by argon to a reaction chamber. As shown in Formula 1, the trimethylaluminum reacts with the hydroxyl groups on the surface of the organic sealing layer 13. In Formula 1, n presents the number of the hydroxyl groups on the organic sealing layer 13.

organic sealing layer surface-$(OH)_n$+$n$Al$(CH_3)_3$→organic sealing layer surface-$(O-Al(CH_3)_2*)_n$+$n$CH$_4$ (Formula 1)

Next, the reaction chamber is purged by an inert gas such as Ar or N$_2$ to remove the redundant trimethylaluminum and the side-product methane. The oxidant H2O is then introduced to the reaction chamber to process the reaction as shown in Formula 2.

organic sealing layer surface-$(O-Al(CH_3)_2*)_n$+$2n$H$_2$O→organic sealing layer surface-$(O-Al-(OH)_2*)_n$+$2n$CH$_4$ (Formula 2)

Next, the reaction chamber is purged by the inert gas such as Ar or N$_2$ to remove the redundant moisture and the side-product methane. Formula 1, the purge step, Formula 2, and the purge step are called an ALD cycle. After the ALD cycle, the hydroxyl groups will be distributed on the inorganic oxide layer again. The ALD cycle can be repeated until the inorganic oxide layer 15 is grown to a desired thickness. It is understood that the surface of the organic sealing layer 13 and the inorganic oxide layer 15 have covalent bondings therebetween. The inorganic oxide layer 15 can be a single layered material such as aluminum oxide, zinc oxide, zirconium oxide, silicon oxide, or hafnium oxide, or a multi-layered structure such as alternately arranged aluminum oxide/zirconium oxide. In one embodiment, the inorganic oxide layer 15 has a thickness of 5 nm to 100 nm. An overly thin inorganic oxide layer 15 cannot prevent the optotronic device 11 from damage of moisture or other pollutants. On the other hand, an overly thick inorganic oxide layer 15 will reduce the transmittance and the flexibility of the package structure. When the inorganic oxide layer 15 is a dense, continuous, and nano-scaled structure, the flexibility of the organic sealing layer 13 will not influenced. In this condition, the encapsulation film composed of the inorganic oxide layer and the organic sealing layer would be flexible. If the substrate 10 and the optotronic device 11 are flexible as the described encapsulation film, a flexible package structure would be achieved.

EXAMPLES

Moisture permeation ratios of the encapsulation films were measured by a MOCON Aquatran commercially available from the MOCON Company. The helium permeation ratios of the encapsulation films were measured by a Helium leakage Detector. The oxygen permeation ratios of the encapsulation films were measured by a MOCON Oxtran commercially available from the MOCON Company.

Example 1

An aluminum oxide layer was deposited on a polyvinyl butryl-vinyl alcohol-vinyl acetate film (commercially available from Chang Chun Chemical) by ALD at 120° C. The deposition steps are described as below:

a. The described copolymer film was charged in a reaction chamber of an ALD apparatus commercially available from the Cambridge NanoTech Company. Trimethylaluminum gas with a pulse of 0.03 seconds was then introduced into the reaction chamber for deposition at 120° C.

b. The reaction chamber was then purged by Ar and vacuumed for 5 seconds.

c. a water vapor of 25° C. with a pulse of 0.02 second was then introduced into the reaction chamber.

d. The reaction chamber was then purged by Ar and vacuumed for 5 seconds.

e. The steps a. to d. were repeated 70 times to obtain an aluminum oxide layer which formed on the copolymer film, wherein the aluminum oxide layer had a thickness of 35 nm.

Example 2

Aluminum oxide layer was deposited on a PVA film (commercially available from Chang Chun Chemical, see Formula 3) by ALD at 120° C. The deposition steps were similar to those of Example 1. In Example 2, the aluminum oxide layer on the PVA film was 35 nm.

(Formula 3)

Example 3

An aluminum oxide layer (thickness of 2 Å) and hafnium oxide layer (thickness of 3 Å) were alternately deposited on a PVA film (commercially available from Chang Chun Chemical) by ALD at 120° C. The deposition steps are described as below:

a. The described PVA film was charged in the reaction chamber of an ALD apparatus commercially available from the Cambridge NanoTech Company. Trimethylaluminum gas with a pulse of 0.03 second was then introduced into the reaction chamber for deposition at 120° C.

b. The reaction chamber was then purged by Ar and vacuumed for 5 seconds.

c. a water vapor of 25° C. with a pulse of 0.02 second was then introduced into the reaction chamber.

d. The reaction chamber was then purged by Ar and vacuumed for 5 seconds.

e. Tetra(dimethylamino) hafnium gas with a pulse of 0.03 second was then introduced into the reaction chamber for deposition at 120° C. Thereafter, the steps b. to d. were repeated once.

f. The steps a. to e. were repeated 70 times to obtain a multi-layered structure of alternately arranged aluminum oxide/hafnium oxide formed on the PVA film, wherein the multi-layered structure had a thickness of 35 nm.

Example 4

6 mole of HEMA (2-hydroxyethyl 2-methylprop-2-enoate, see Formula 4) and 4 mole of MMA (methyl 2-methylpropenoate, See Formula 5) were dissolved in methanol under nitrogen. 80 mg of azobisisobutyronitrile (AIBN) was added to the methanol solution. The methanol solution was then heated to 65° C. and horizontal vibrated of 400 rpm to react for 24 hours. Obviously, the hydrophilic monomer HEMA and the hydrophilic monomer MMA had a molar ratio of greater than 50:50. The copolymer of HEMA and MMA was then coated on a substrate to form a film. Thereafter, an aluminum oxide film was deposited on the copolymer film at 120° C. by ALD as described in Example 1. The aluminum oxide film had a thickness of 35 nm.

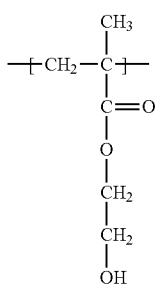

(Formula 4)

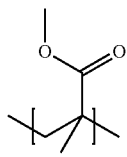

(Formula 5)

Comparative Example 1

An aluminum oxide film was deposited on a polyimide (PI, see formula 6) film at 120° C. by ALD as described in Example 1. The aluminum oxide film had a thickness of 35 nm. As shown in Formula 6, PI was free of hydrophilic group such as hydroxyl group.

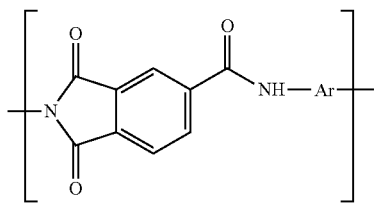

(Formula 6)

The moisture permeation ratios, the oxygen permeation ratios, and the helium permeation ratios of the copolymer film, the PVA film, and the encapsulation films in Examples 1-3 are tabulated in Table 1.

As shown in Table 1, the aluminum oxide layers formed by deposition may dramatically reduce the moisture permeation ratio of the copolymer containing the hydroxyl groups. As shown in comparisons between Examples 1, 2, 4 and Comparative Example 1, when the molar ratio of the hydrophilic monomer and the hydrophobic monomer in the copolymer increases, the helium permeation ratio of the encapsulation film is decreased. If the hydroxyl groups on the organic film are more, the covalent bondings between the organic film surface and the deposited aluminum oxide will be denser to further reduce the moisture/oxygen/helium permeation ratios of the encapsulation film. In general, the PVA film contains more hydroxyl groups than the polyvinyl butryl-vinyl alcohol-vinyl acetate film, such that the former has a greater moisture permeation ratio than the latter. Thus, the covalent bondings between the aluminum oxide (deposited by ALD) and the PVA film surface will be denser due to the PVA film containing more hydroxyl groups, and moisture permeation of the encapsulation film is further reduced. The PVA film with high moisture absorption is generally considered as a bad choice as a material to package optotronic devices, however, the PVA film with the aluminum oxide layer formed by ALD is a better encapsulation film compared with the copolymer containing less hydroxyl groups. In addition, even if the multi-layered structure of the alternately arranged aluminum oxide/hafnium oxide (e.g. Example 3) and the single layered aluminum oxide layer (e.g. Example 2) have the same thickness, the former has lower moisture, oxygen, and helium permeation ratios with compared with the latter.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method for forming a package structure, comprising:
providing an optotronic device;
wrapping the optotronic device by an organic layer composed of a polymer having hydrophilic groups; and

TABLE 1

|  | Copolymer film | PVA film | Example 1 | Example 2 | Example 3 | Example 4 | Comparative Example 1 |
| --- | --- | --- | --- | --- | --- | --- | --- |
| ALD period (hour) | 0 | 0 | 1.5 | 1.5 | 1.5 | 1.5 | 1.5 |
| Inorganic oxide layer thickness | 0 | 0 | 35 nm | 35 nm | 35 nm | 35 nm | 35 nm |
| Moisture Permeation ratio ($g/m^2 \cdot day$) | >1500 | >1500 | 144.5 | 0.041 | <$10^{-4}$ | Not available | Not available |
| Oxygen Permeation ratio (c.c./ $m^2 \cdot day$) | 8 | 5 | 0.5 | 0.35 | <$10^{-2}$ | Not available | Not available |
| Helium permeation ratio (c.c./ $m^2 \cdot day$) | >900 | >900 | 6.09 | 4.35 | 4.35 | 69.6 | 116.3 | depositing an inorganic oxide layer on the organic layer by an atomic layer deposition process, wherein the inorganic oxide layer directly contacts the organic layer, wherein the inorganic oxide layer and the organic layer have covalent bondings therebetween, wherein the hydrophilic groups are hydroxyl groups or carboxylic acid groups, wherein the inorganic oxide layer is a multi-layered structure of alternately arranged aluminum oxide/hafnium oxide.

2. The method as claimed in claim 1, wherein the organic layer comprises polyvinyl alcohol.

3. The method as claimed in claim 1, wherein the polymer of the organic layer is polymerized by a first monomer having hydrophilic groups and a second monomer not having any hydrophilic groups, and the first monomer and the second monomer have a molar ratio greater than 50:50.

4. The method as claimed in claim 1, wherein the inorganic oxide layer has a thickness of about 5 nm to 100 nm.

5. The method as claimed in claim 1, wherein the step of depositing the inorganic oxide layer on the organic layer by the atomic layer deposition process is performed at a temperature of 25° C. to 120° C.

* * * * *